US006265656B1

(12) United States Patent
Berth

(10) Patent No.: US 6,265,656 B1
(45) Date of Patent: Jul. 24, 2001

(54) DIELECTRIC MATERIAL HOUSING FOR AN ASSEMBLY WHICH IS AT HIGH VOLTAGE

(75) Inventor: Matthias Berth, Baden (CH)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/390,677

(22) Filed: Sep. 7, 1999

(30) Foreign Application Priority Data

Sep. 9, 1998 (DE) .............................................. 198 41 134

(51) Int. Cl.$^7$ ....................................................... H02G 3/08
(52) U.S. Cl. ............................ 174/50; 174/17 R; 361/603
(58) Field of Search .................... 174/48, 50, 58, 174/59, 50.52, 17 R, 17.05, 30, 50.62, 49, 17 VA, 50.59, 52.4, 171 F; 220/3.2, 3.8, 4.02; 248/900; 361/603, 638, 649, 746, 722, 762

(56) References Cited

U.S. PATENT DOCUMENTS

| | | | | |
|---|---|---|---|---|
| 3,599,134 | * | 8/1971 | Galloway | 174/50 |
| 3,611,225 | * | 10/1971 | Dakin | 336/58 |
| 3,670,276 | * | 6/1972 | Theodore | 174/17 SF |
| 3,801,727 | * | 4/1974 | Wilkinson et al. | 174/50 |
| 3,912,985 | * | 10/1975 | Sawchuk | 174/50.52 |
| 3,934,332 | * | 1/1976 | Trunzo | 29/605 |
| 4,190,732 | * | 2/1980 | Galloway et al. | 174/17 LF |
| 5,612,424 | * | 3/1997 | Sato et al. | 525/530 |

FOREIGN PATENT DOCUMENTS

| | | |
|---|---|---|
| 2740371 | 3/1978 | (DE) . |
| 89 09 674 U | 11/1989 | (DE) . |
| 4315772A1 | 11/1994 | (DE) . |
| 4318367A1 | 12/1994 | (DE) . |
| 4436592C2 | 4/1996 | (DE) . |
| 296 08 312 U1 | 8/1996 | (DE) . |

OTHER PUBLICATIONS

"Eine neue Einheitsreihe von Mittelspannungs–Schaltfeldern fur olarme und SF6–Schaltgerate", Munzinger, et al., Brown Boveri Mitt., Nov. 1977, p. 634–635.

* cited by examiner

*Primary Examiner*—Anthony Dinkins
*Assistant Examiner*—Angel R. Estrada
(74) *Attorney, Agent, or Firm*—Burns, Doane, Swecker & Mathis, L.L.P.

(57) ABSTRACT

A dielectric material housing for accommodating an assembly such as a high voltage, power-electronics assembly. The housing is, for example, in a cuboid shape and has a U-shaped wall section which extends from its top surface via its front surface to its bottom surface, to whose outer surface ground potential can be applied, and to whose inner surface high voltage can be applied. An opening for an electrical connection of the assembly is provided in sections of the housing wall which forms the two side surfaces of the housing.

11 Claims, 4 Drawing Sheets

DIELECTRIC MATERIAL HOUSING FOR AN ASSEMBLY WHICH IS AT HIGH VOLTAGE

BACKGROUND OF THE INVENTION

1. Field of the Invention

The invention is based on a dielectric material housing for an assembly which is at high voltage, preferably a power-electronics assembly, having two electrical connections which can be routed out of the housing. Housings of the abovementioned type are frequently used in the high and medium-voltage area in power engineering in order to hold and to enclose electrically active parts which are at high potential.

2. Discussion of Background

A dielectric material housing of the type mentioned above is described, for example, in Brown Boveri Report 11–77, page 634. This housing has an essentially tubular shape, and encloses a contact arrangement of a power breaker. Two electrical connections which have a DC connection to the contact arrangement are passed through the casing surface and one end surface of the housing. The housing is arranged, protected against direct contact, in a metal cabinet which can be locked.

SUMMARY OF THE INVENTION

Accordingly, one object of the invention as it is specified in the patent claims is to provide a novel dielectric material housing for an assembly which is at high voltage, which housing is distinguished by a small space requirement and can at the same time be installed in a space-saving manner in a predetermined small volume in an installation containing the assembly.

The dielectric material housing according to the invention is distinguished by the fact that the majority of its surface is designed to be protected against direct contact, and that it can thus be inserted into a very small volume, supported on this part of the surface, with its walls being at frame or ground potential. Electrical connections which are routed out of the housing at the side can now be connected in a very space-saving manner to the electrical connections of assemblies which are each arranged in identical dielectric material housings and/or are connected to a high-voltage or grounding conductor, which is routed into the interior of the small volume, of an installation containing the assemblies.

A very compact and dielectrically particularly advantageous dielectric material housing is obtained if, in addition to the housing geometry being of optimum design, materials are at the same time used which are designed to be dielectrically suitable, and if critical areas, such as the junction between the housing surface which is at frame or ground potential and the dielectrically highly loaded side surfaces, are dielectrically relieved of the load by means of suitably designed and arranged field control means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
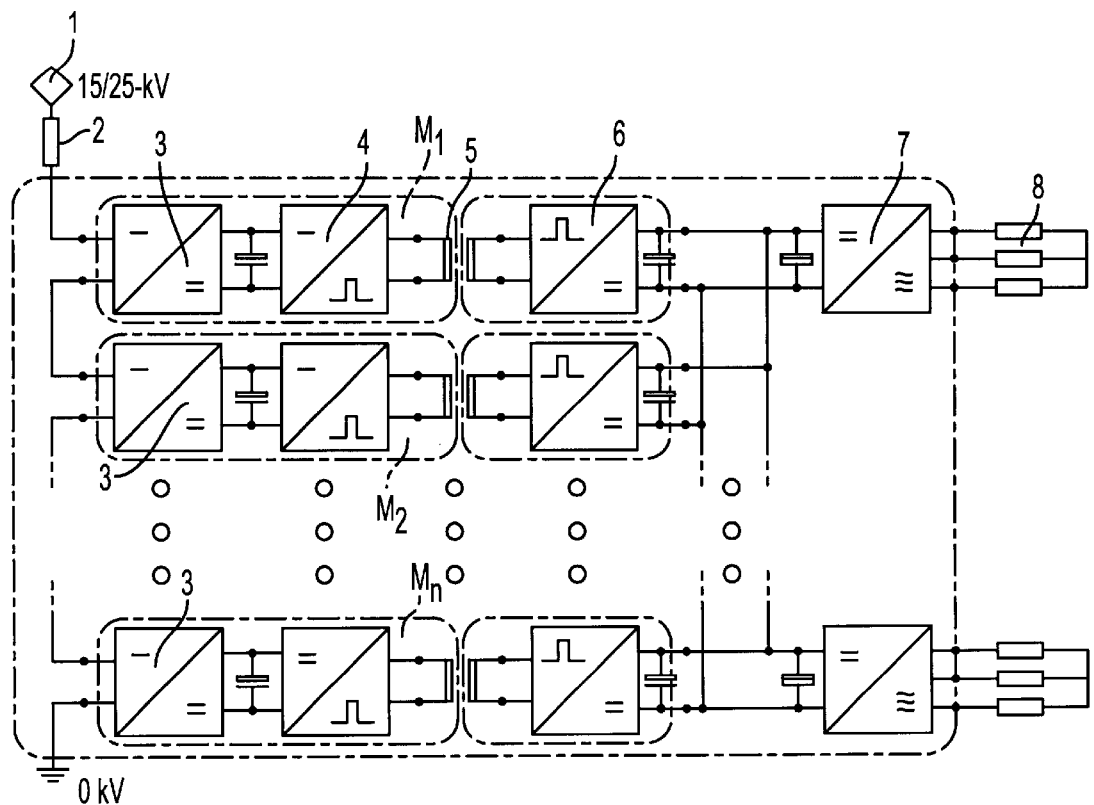
FIG. 1 shows a block diagram of the drive for a railroad vehicle having a circuit arrangement of modular construction.
Figure 2:
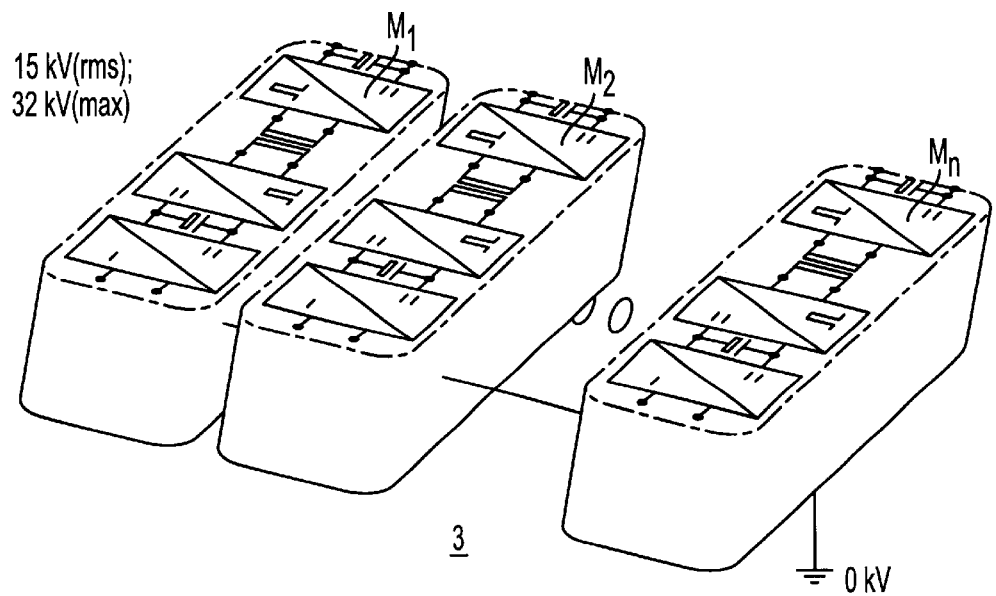
FIG. 2 shows a perspective view of the circuit arrangement shown in FIG. 1, illustrated in highly simplified form.

Referring now to the drawings, wherein like reference numerals designate identical or corresponding parts throughout the several views, the drive for a railroad vehicle, which is illustrated as a block diagram, contains an electrical pick-up 1, which can be guided on a high-voltage cable with an AC voltage of, for example, 15 or 25 kV and is connected via an input induction coil 2 to a first input (which is at high potential) of a circuit arrangement 3. A second input of the circuit arrangement 3 is connected to ground potential or frame. The circuit arrangement 3 is formed from n (n=2, 3, ...) series-connected power-electronics modules $M_1$, $M_2$, ... $M_n$ which each have a DC isolation point and of which the module $M_1$ is at high voltage and the module $M_n$ is at frame or ground potential. The modules are of identical design and each have power electronics, which are surrounded by a dielectric material housing and are designed as a converter system, as well as two inputs, one of which is connected to the upstream module in series circuit, and a second of which is connected to the downstream module in the series circuit. In contrast to this, the first input of the module $M_1$ is at high voltage, and the second input of the module $M_n$ is at ground potential or frame. Each module has a power-electronics assembly 4 which is connected to the two inputs, a transformer 5 which forms a DC isolation point, and a power-electronics assembly 6 which is connected downstream of the transformer 5 and has two outputs which pass out of the module. The outputs lie parallel and are connected via m(m=1,2, ...) converter systems 7 to m drives 8.

As can be seen from FIGS. 2 to 6, the modules have an essentially cuboid design and are arranged parallel to one another and at a short distance apart from one another compared with their height, on a plate 9 (FIG. 4) which is at frame or ground potential. The modules each have a dielectric material housing 10 which is designed predominantly in a cuboid shape. On their top surface 11 and bottom surface 12 as well as their front face 13 (which is closed at the front) the dielectric material housings 10 each have an electrically conductive layer which can be kept at frame or ground potential. An opening for an electrical connection of the power-electronics assembly 4 that is at high voltage is in each case provided in sections (which are designed to be predominantly flat) of the housing wall which forms the two side surfaces 14, 15 of the housing (10). The electrical connections of adjacent modules, for example $M_1$ and $M_2$, are connected to contacts 16, 17 of a contact arrangement which connects the modules in series.

The modules $M_1$, $M_2$ . . . are each mounted moveably on the plate 9, at right angles to the front face 13 of the dielectric material housing 10. The contact arrangement can be operated by moving two adjacent modules with respect to one another. One of the two contacts 16, 17 of the contact arrangement, namely the contact 17, has a guide surface 19 which is inclined with respect to the pushing direction (double arrow 18 in FIG. 3), interacts with the mating contact 16 on movement and, depending on the direction in which the module is pushed, is engaged with or disengaged from pins 20, which are mounted in a sprung manner, of the mating contact 16.

Figure 4:
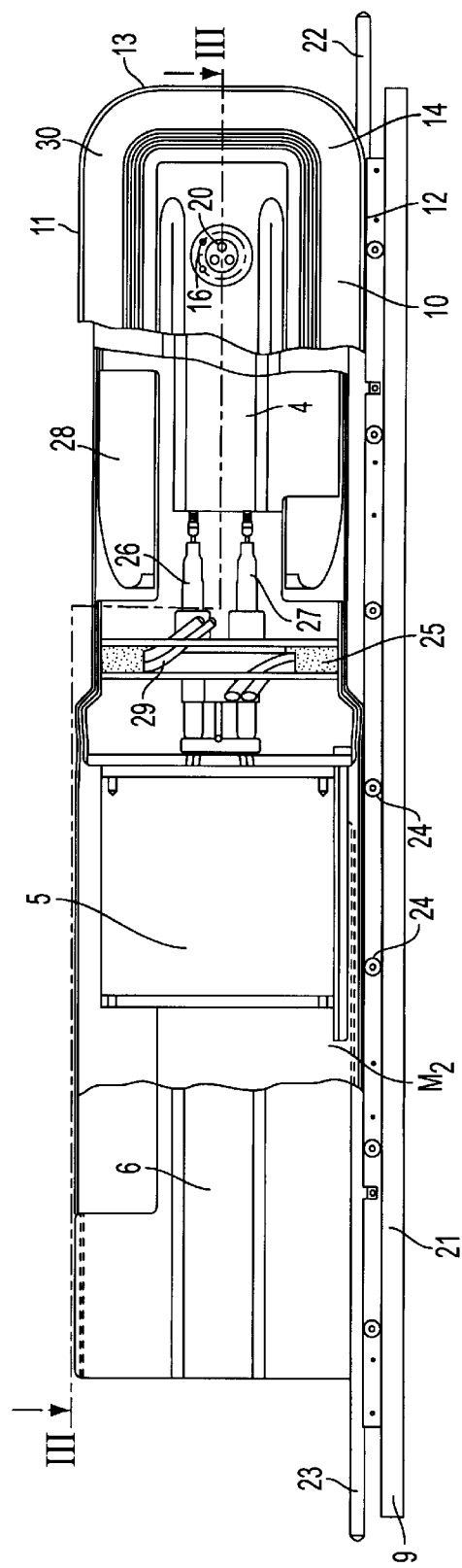
FIG. 4 shows a side view of the housing shown in FIG. 3, sectioned along the line IV—IV, in which a part of the housing which is not sectioned is illustrated slightly enlarged.

It can be seen from FIG. 4 that there is an essentially rectangular guide element 21, in the form of a carriage and with handles 22, 23, on the bottom surface of the module $M_2$. On its longitudinal sides which act as runners, this guide element has rollers 24, which are guided on two rails (which are not shown) that are formed in the plate 9. The handles project beyond the dielectric material housing 10 on the front face 13 and/or rear face of the dielectric material housing 10.

Figure 5:
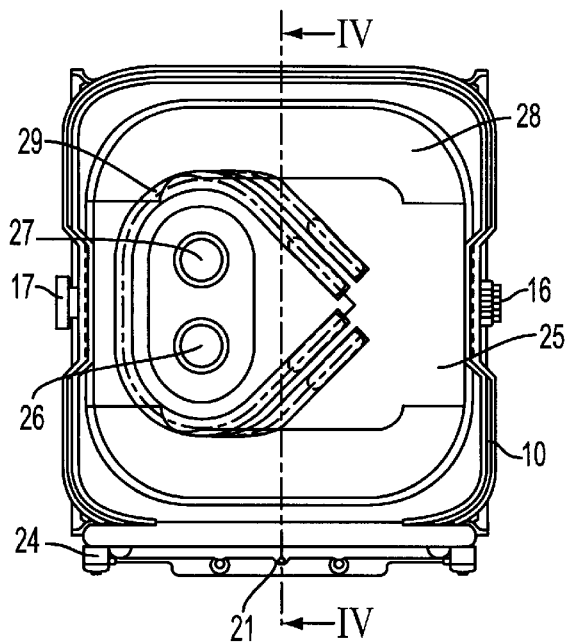
FIG. 5 shows a view from the left of the dielectric material housing shown in FIG. 3, sectioned along the line V—V.
Figure 6:
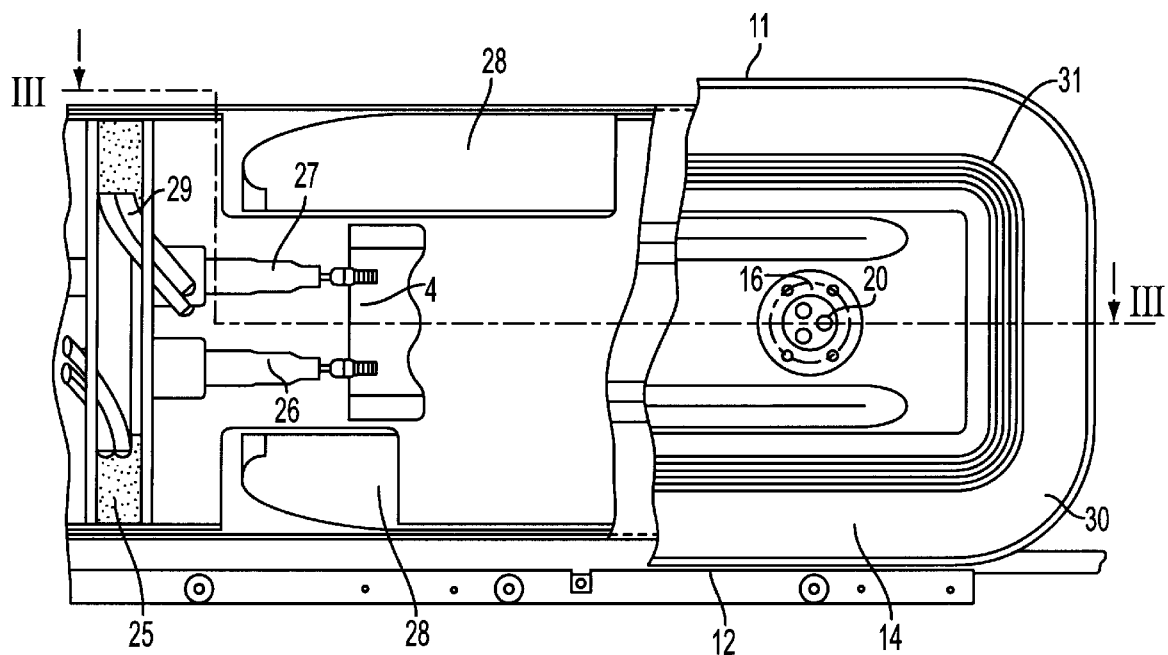
FIG. 6 shows an enlarged illustration of a part of the housing shown in FIG. 4.

FIGS. 4 to 6 furthermore show that the transformer 5 and the power-electronics assembly 6 are arranged in the dielectric material housing, and that the dielectric material housing 10 furthermore upholds an insulating intermediate wall 25, which separates the power-electronics assembly 4 (which is arranged in the right-hand part of the dielectric material housing 10) from the transformer 5 and from the second power-electronics assembly 6. The electrical connections of the transformer 5, which are at high voltage, are passed through the intermediate wall 25. The electrical connections which are passed through the intermediate wall 25 are preferably each designed in the form of a cable termination 26, 27. In consequence, advantageous dielectric characteristics (such as, in particular, a high breakdown strength and a good creepage-current behavior) are obtained, using simple means, at the junction between the power-electronics assembly 4 which is at high voltage and the power-electronics assembly 6 which is at a lower voltage. Particularly advantageous dielectric characteristics are achieved if the cable terminations 26, 27 are firmly connected to the intermediate wall 25 and project into an area of the dielectric material housing 10 which is shielded by a control electrode 28 in the form of a cap and accommodates the power-electronics assembly 4. The dielectric behavior of the module is additionally improved by matching the design of the control electrode 28 to the arrangement and to the configuration of the cable terminations 26, 27.

In order to increase the transmitted power, cooling channels 29 are formed in the insulating intermediate wall 25, through which channels 29 coolant is passed, which is used to cool the power-electronics assemblies 4, 6 and the transformer 5. This coolant is advantageously a liquid, for example water, which is passed through hoses which are laid in the cooling channels 29.

For manufacturing reasons, an embodiment of the module $M_2$, in which the power-electronics assemblies 4 and 6 as well as the transformer 5 are inserted into the dielectric material housing 10, is to be preferred. When servicing is due, the module is then pushed out of the circuit arrangement 3, and the individual assemblies 4, 6 or the transformer 5 can quickly be removed from the dielectric material housing 10. However, it is also possible to keep the dielectric material housing 10 small and to arrange only the power-electronics assembly 4 and the electrical connections to the transformer 5 (which are designed as cable terminations 26, 27) in the dielectric material housing 10.

Figure 3:
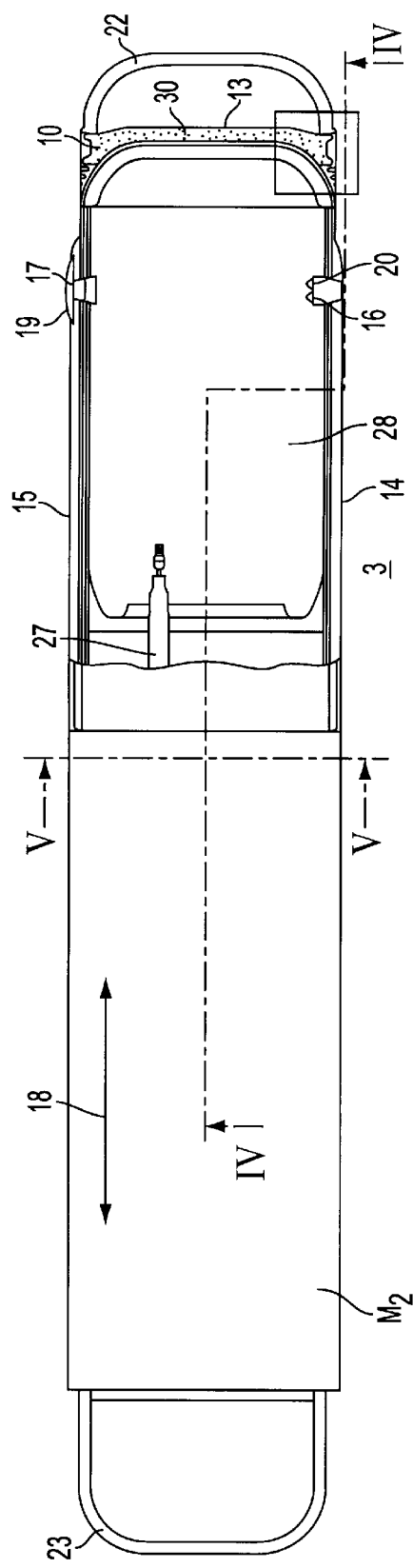
FIG. 3 shows a view of a dielectric material housing according to the invention for a module $M_2$ of the circuit arrangement shown in FIGS. 1 and 2, sectioned along a line III—III which can be seen in FIG. 4.

As can be seen from FIG. 3, the dielectric material housing 10 has, on the front face, a wall section 30 which is designed to be particularly thick in comparison with the wall thickness of the dielectric material housing in the region of the side surfaces 14, 15. This wall section 30 is designed essentially in U-shape and extends from the top surface 11, via the front face 13, to the bottom surface 12. The U-shaped wall section 30 ensures electrical insulation between the power-electronics assembly 4 (which may be of high voltage) and the outer surfaces (to which frame or ground potential can be applied and which are provided with electrically conductive layers), namely the top surface 11, front face 13 and bottom surface 12 of the dielectric material housing 10. The U-shaped wall section 30 of the dielectric material housing has less electrical capacitance per unit area than its wall sections which form the side surfaces 14, 15.

The U-shaped wall section 30 contains a material having a lower dielectric constant than the material which forms the side surfaces 14, 15 of the dielectric material housing 10. The material of the U-shaped wall section 30 advantageously has a pore structure, and is preferably in the form of a foam material or a plastic filled with hollow balls. Dielectric constants of about 2 can be achieved with such a material. A material with a low dielectric constant, and, in addition, high mechanical strength may have a sandwich structure with a layer which forms the outer surface of the wall section and a layer which forms the inner surface of the wall section each being composed of a mechanically high-quality dielectric material, for example a laminate based, for example, on epoxy and glass fibers, and a thicker layer (arranged in between) composed of a material having a low dielectric constant, for example foam material or plastic filled with hollow bodies. The laminate used in this case also forms the side surfaces 14, 15 and has a dielectric constant of at least four while, in contrast, the dielectric constant of the material having a sandwich structure has a mean value of somewhat more than 2.

In order to improve the insulation, the cap-shaped control electrode 28 is arranged between the assembly 4 and the U-shaped wall section 30. This control electrode is arranged at a distance from the wall section 30, to be precise such that the distance increases from the front face 13 of the dielectric material housing 10 toward the DC isolation point formed by the transformer. This ensures that the electrical field is homogenized particularly well between high voltage and frame or ground potential, and dielectrically disadvantageous increased field areas are largely avoided. The control electrode 28 is advantageously composed of electrically conductive plastic and has a metallic coating on its inner side. The electrical field of the module $M_2$ can thus be capacitively controlled particularly well, and thus homogenized extremely advantageously, together with the metallic coating which is applied to the top surface 11, the front face 13 and the bottom surface 12 of the U-shaped wall section 30.

Figure 7:
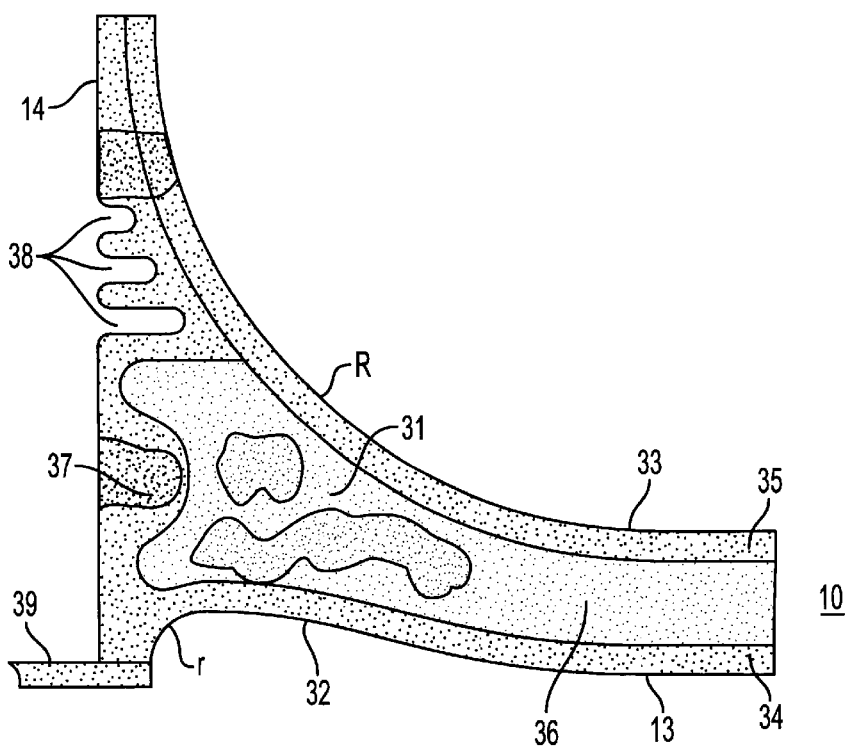
FIG. 7 shows an enlarged illustration of a section of the dielectric material housing which is shown with a boundary round it in FIG. 3.

FIG. 7 shows the configuration and the material structure of the dielectric material housing 10 in the dielectrically particularly highly loaded junction region between the front face 13 and the side surface 14. This dielectrically highly loaded region is designed as a rim profile 31 and continues into the rims of the side surface 14, which are adjacent to the top surface 11 and bottom surface 12. The dielectrically highly loaded rim profile 31 surrounds the contact 16, which is provided in the side surface 14, in a U-shape (see FIGS. 4 and 6). A corresponding profile is also provided on the side surface 15. The rim profile 31 is angled. One limb of the angle, which extends into the side surface 14, is formed by the mechanically high-quality material with a comparatively high dielectric constant. The limb of the angle which extends into the front face 13, the top surface 11 and the bottom surface 12 has a sandwich structure. The outer surface (formed by the front face 13 and the side surface 14) and the inner surface 33 of this sandwich structure are each formed by layers 34, 35 of a material having a relatively high dielectric constant. A relatively thick layer 36 located in between is formed from the material having a relatively low dielectric constant. Thus, overall, the material of the sandwich structure has a relatively low dielectric constant in comparison with the material in the side surface 14. This material structure considerably assists the homogenization of the electrical field on the surface of the rim profile 31.

On its inner surface 33 facing the power-electronics assembly 4, the rim profile 31 has a concave surface which is formed by an electrically conductive coating and has a greater radius of curvature R than a concave surface 32 which is arranged on its front face 13, is curved in the opposite direction, is formed by an electrically conductive coating and has a radius r. The electrical field in the rim profile 31 is homogenized by the magnitudes of the radii and the opposing curvatures of the surfaces 32, 33, which are designed to be electrically conductive and are preferably metallized, and the electrical field is thus distributed even better on the uncoated side surface 14.

The rim profile 31 has a bead 37 which is designed in a U-shape and is composed of the same material as the side surface 14. This bead extends from the rim of the side surface 14 into the layer 36 composed of the material having a low dielectric constant. Together with the material of the layer 36, this bead produces additional homogenization of the electrical field on that part of the surface of the rim profile 31 which is located on the side surface 14. Grooves 38 which are surrounded by the bead 37 and run parallel to the rim are also formed in the side surface 14. These grooves on the one hand reduce the electrical field strength in the region of the bead 37, and on the other hand lengthen the creepage path along the surface of the rim profile 31 between frame or ground potential and high voltage (contact 16). The lengthened creepage path is advantageous particularly for improving the dielectric strength of the housing 10 in the event of contamination and/or in the event of moisture.

The bead 37 and the grooves 38 can be stamped into the side surface 14 in a manner which is advantageous for production reasons. An insulating barrier 39 which extends beyond the side surface 14 is adjacent to the concave outer surface 32. This barrier prevents the origination of surface charges, which originate from frame or ground potential.

Figure 8:
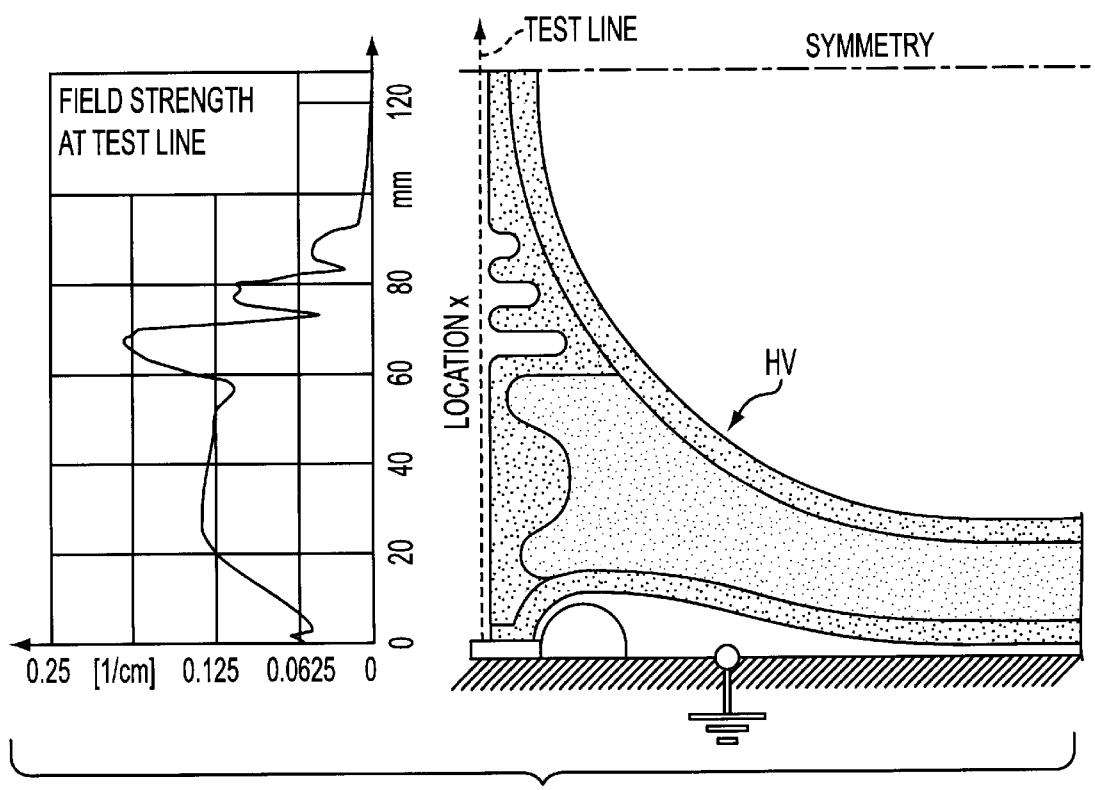
FIG. 8 shows a diagram, illustrating the distribution along a test line of the electrical field strength which acts on the dielectric material housing section shown in FIG. 7.

As can be seen from FIG. 8, the electrical field strength in the region of the bead 37 is virtually independent of position. Relatively high field strength peaks admittedly occur in the region of the grooves 38. However, owing to the insulating airgaps there, these peaks are not critical. The resultant voltage drops across the grooves 38 reduce the electrical field strength along the surface of the rim profile 31 in the region of the bead 37, however. As can be seen, the electrical field strength on the dielectric material barrier 39 is particularly low.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letter Patent of the United States is:

1. A dielectric material housing for an assembly which is at high voltage and has two electrical connections which can be routed out of the housing,
   the housing being generally formed as a cuboid, comprising:
   a top surface, a front surface, a bottom surface, and two side surfaces; and
   a U-shaped wall section,
   said U-shaped wall section extending from said top surface via said front surface to said bottom surface and having an inner and an outer surface and having less electrical capacitance per unit area than said side surfaces, said outer surface for receiving a ground potential and said inner surface for receiving a voltage potential higher than the ground potential, and
   wherein an opening for an electrical connection of the assembly is provided in said side surfaces.

2. The dielectric material housing as claimed in claim 1, wherein:
   a thickness of said U-shaped wall section is greater than a thickness of said side surfaces.

3. The dielectric material housing as claimed in claim 2, wherein:
   said U-shaped wall section contains a material having a lower dielectric constant than a material of said side surfaces.

4. The dielectric material housing as claimed in claim 3, wherein:
   said U-shaped wall section has a pore structure formed using at least one of foam or plastic filled with hollow bodies.

5. The dielectric material housing as claimed in claim 3, wherein the U-shaped wall section comprises:
   a sandwich structure with a first layer, a second layer and an intermediate layer, said first layer forming said outer surface, said second layer forming said inner surface and said intermediate layer being thicker than said first and second layer and being arranged between said first and second layer, said first and second layers each being composed of a mechanically insulating material and said intermediate layer being composed of a material having a lower dielectric constant than said first and second layers.

6. The dielectric material housing as claimed in claim 1, wherein
   at least one rim profile is formed in said U-shaped wall section, said rim profile merging into one of said side surfaces and having an inner concave surface facing the assembly and an outer concave surface, said inner concave surface having a greater radius of curvature than said outer concave surface, said outer concave surface being curved in an opposite direction than said inner concave surface.

7. The dielectric material having as claimed in claim 6, wherein said at least one rim provide has a bead, said bead having a U-shape and being composed of the material used as said one of said side surfaces and extending from the rim of said one of said side surfaces into the material whose dielectric constant is lower than that of the side surfaces.

8. The dielectric material having as claimed in claim 7, comprising:

grooves formed in said one of said side surfaces which is associated with said bead, said grooves being surrounded by said bead and running parallel to said rim.

9. The dielectric material housing as claimed in claim 8, wherein said bead and said grooves are stamped into said one of said side surfaces.

10. The dielectric material housing as claimed in claim 6, wherein:

said inner concave surface and said outer concave surface are provided with a metallic coating.

11. The dielectric material housing as claimed in claim 6, wherein an insulating barrier is provided adjacent to said outer concave surface, said insulating barrier projecting beyond said one of said side surfaces.

* * * * *